United States Patent [19]

Tiemann

[11] 4,284,908

[45] Aug. 18, 1981

[54] CHARGE DOMAIN FILTER WITH SINGLE TRANSMISSION ZERO

[75] Inventor: Jerome J. Tiemann, Schenectady, N.Y.

[73] Assignee: General Electric Company, Schenectady, N.Y.

[21] Appl. No.: 153,687

[22] Filed: May 27, 1980

[51] Int. Cl.³ .................... G11C 19/28; H01L 29/78; H03H 15/02

[52] U.S. Cl. .............................. 307/221 D; 357/24; 333/165

[58] Field of Search ............ 357/24; 307/221 D; 333/165

[56] References Cited

U.S. PATENT DOCUMENTS

| | | | |
|---|---|---|---|
| 4,124,861 | 11/1978 | Baertsch et al. | 357/24 |
| 4,124,862 | 11/1978 | Engeler et al. | 357/24 |
| 4,172,983 | 10/1979 | MacLennan | 307/221 D |

Primary Examiner—Gene M. Munson
Attorney, Agent, or Firm—Julius J. Zaskalicky; James C. Davis, Jr.; Marvin Snyder

[57] ABSTRACT

A filter is described utilizing charge transfer devices for providing exponential smoothing of sampled data signals with a transmission zero at a predetermined frequency. A first shift register is provided having N serially coupled stages to each of which is coupled a respective accumulator stage. A second shift register is provided having N serially coupled stages. A sequence of packets of charge is provided, each packet representing a respective sample of an input signal. Each packet of the sequence is divided into a first part and a second part, the ratio of the first part to the second part being equal to a first fixed value. Each of the first parts of the packets of the sequence is applied to the first shift register and is sequentially processed in successive stages thereof to provide an output. Each of the second parts of the packets of the sequence is applied to the second shift register and transferred from stage to stage to provide another output. The frequency response of each of the stages of the first shift register with associated accumulator stage decreases with increase in frequency of the input signal, and the shift in phase of the frequency response increases with increase in frequency of the input signal. Each stage of the first shift register is set to provide a phase shift at a predetermined angular frequency $\omega_z$ which is equal to $\omega$ radians divided by N, the number of stages in the first shift registers. The aforementioned first fixed value is set so that the amplitude of the frequency response of the cascaded stages of the first shift register at the predetermined frequency $\omega_z$ is equal to the amplitude of the frequency response of second shift register at the frequency $\omega_z$. The outputs of the first and second shift registers are combined thereby providing a resultant output in which the signal component of the frequency $\omega_z$ is zero.

2 Claims, 8 Drawing Figures

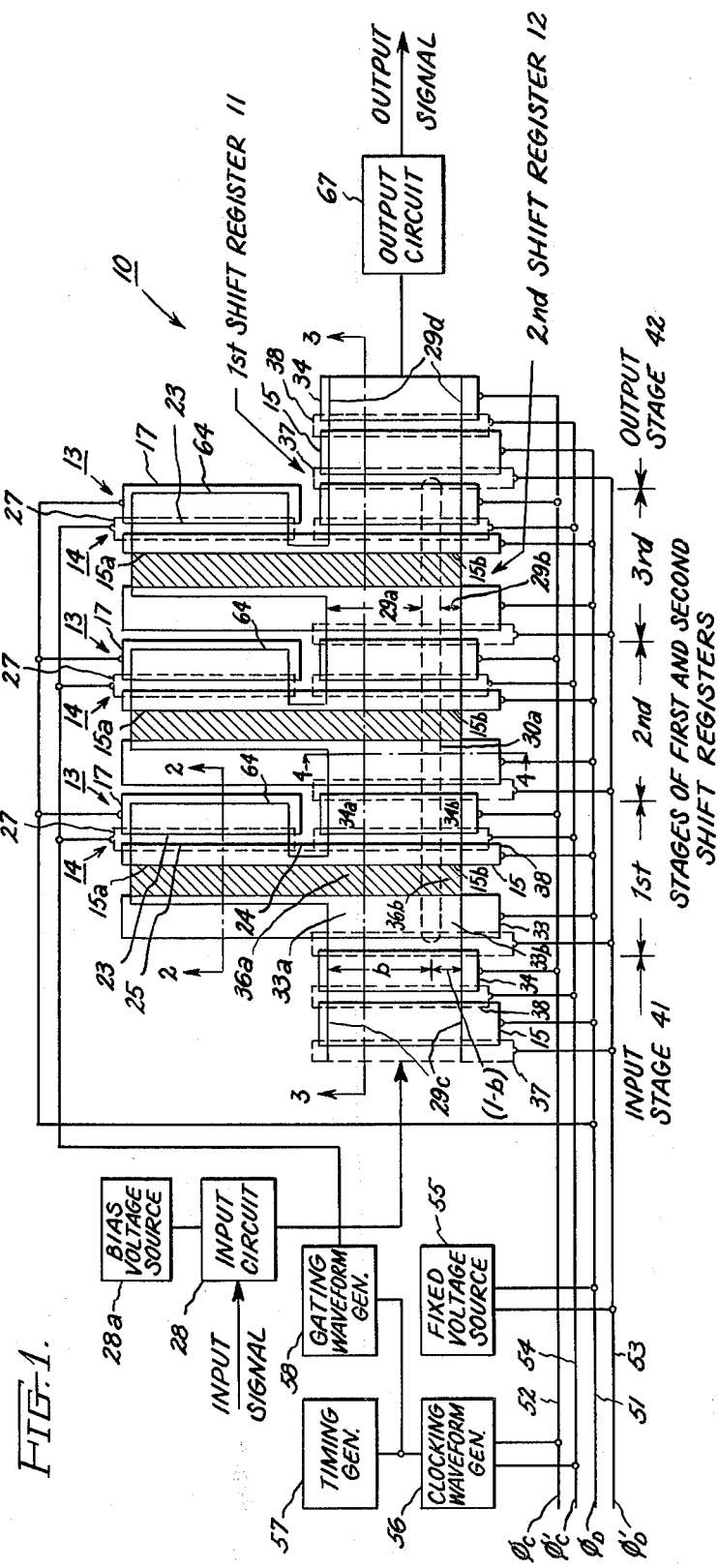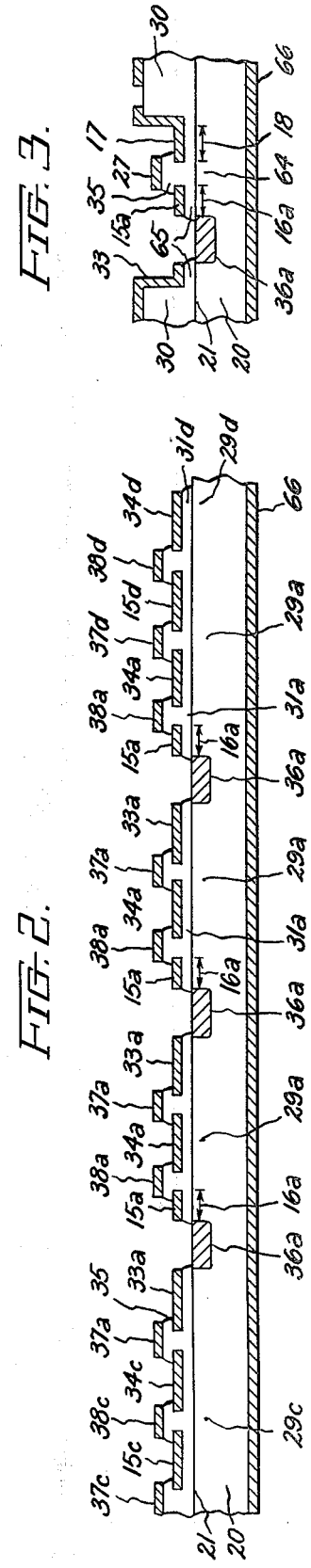

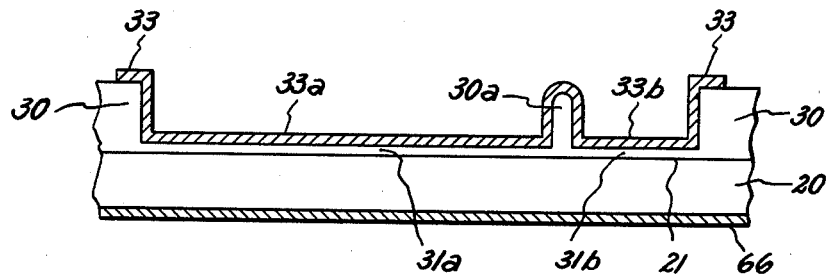
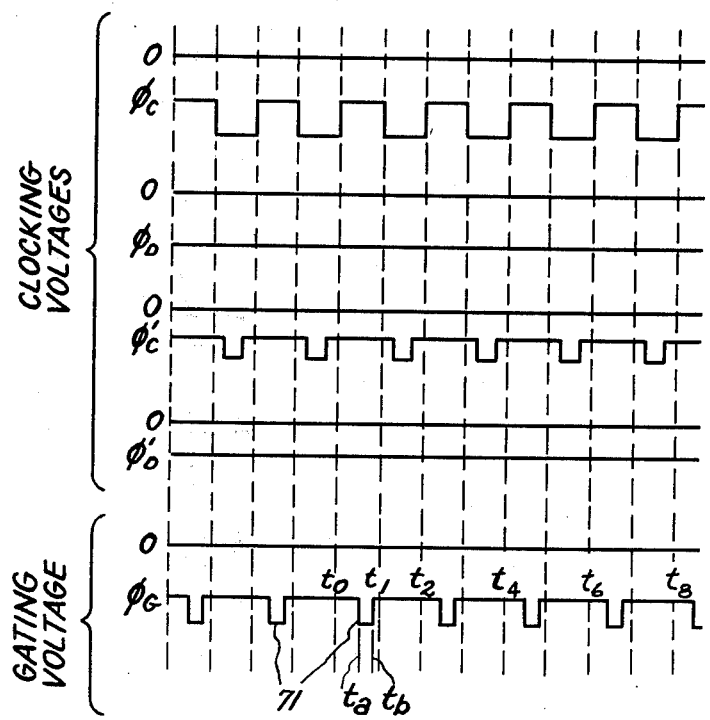

CHARGE DOMAIN FILTER WITH SINGLE TRANSMISSION ZERO

The present invention relates in general to charge transfer signal processing apparatus for providing recursive transfer functions and more particularly to implementing a transmission zero at a particular frequency in such apparatus.

This application is related to patent application Ser. No. 132,777, filed Mar. 24, 1980 and assigned to the assignee of the present invention, and incorporated herein by reference thereto.

An object of the present invention is to provide sampled data filter aparatus which provides impulse responses of infinite duration and which includes a transmission zero at a particular frequency.

Another object of the present invention is to provide sampled data filter apparatus which provides both a transmission zero at a particular frequency and a real pole pair in a single device structure.

In carrying out the present invention in one illustrative embodiment thereof there is provided a substrate of semiconductor material of one conductivity type having a major surface. Means are provided for forming a plurality of N charge storage cells adjacent the major surface of the substrate, each storage cell including a first electrode and a third electrode. The first and third electrodes insulatingly overlie the storage cell, with the first electrode and the substrate forming a first capacitor having a first capacitance, and the third electrode and the substrate forming a third capacitor having a third capacitance. A first shift register is provided having N serially coupled stages, each stage including a respective first charge storage region in the substrate underlying a respective one of the first electrodes. A second shift register is provided having N serially coupled stages, each stage including a respective first charge storage region. First means are provided for sequentially transferring packets of charge at one frequency from first charge storage region to first charge storage region of the stages of the first shift register. Second means are provided for sequentially transferring packets of charge at the aforementioned one frequency from first charge storage region to first charge storage region of the stages of the second shift register.

A first sequence of packets of charge are provided, each packet representing a respective sample of an input signal, successive packets occurring at the aforementioned one frequency. Means are provided for dividing each of the packets of charge of the first sequence into a first part and a second part, the ratio of the first part to the sum of the first part and the second part being equal to a first fixed value. Means are provided for applying sequentially each of the first parts of the packets of the first sequence to the first stage of the first shift register and for applying sequentially each of the second parts of the packets of the first sequence to the first stage of the second shift register. A plurality of combining means are provided, each for combining the charge packet in the first charge storage region of a respective stage of the first shift register with a charge packet in an associated third charge storage region and for dividing the combined packet of charge into two portions over one part of a cycle of the first charge transferring means. A first portion of the combined packet being stored in the first charge storage region of a stage of the first shift register and a second portion of said combined packet being stored in the third charge storage region associated therewith. The ratio of the first portion of charge to the combined packet of charge is equal to the ratio of the third capacitance to the sum of the first capacitance and the third capacitance, referred to as a second fixed value. The frequency response of each of the stages of the first shift register decreases as the frequency of the input signal thereto increases. The shift in phase shift of the frequency response of each of the stages of said first shift register increases as the frequency of the input signal thereto increases.

The second fixed value is set to provide a phase shift at a predetermined angular frequency $\omega_z$ which is equal to radians divided by an integer, the interger being equal to N, the number of stages in each of the first and second shift registers. The first fixed value is set equal to $1/1 + |H_N(\omega_z)|$, where $|H_N(\omega_z)|$ is the absolute magnitude of the amplitude response of N cascaded stages of the first shift register at the predetermined angular frequency $\omega_z$. Means are provided for combining the output of the last stage of the first shift register with the output of the last stage of the second shift register, whereby a resultant output is obtained having zero amplitude at the predetermined angular frequency $\omega_z$.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIG. 1 shows a plan view of one embodiment of the present invention.

FIG. 2 shows a sectional view of the apparatus of FIG. 1 taken along section lines 2—2 of FIG. 1.

FIG. 3 shows a sectional view of the apparatus of FIG. 1 taken along section lines 3—3 of FIG. 1.

FIG. 4 shows a sectional view of the apparatus of FIG. 1 taken along section lines 4—4 of FIG. 1.

FIGS. 5A through 5E show diagrams of voltage waveforms useful in explaining the operation of the apparatus of the present invention.

Figure 6:
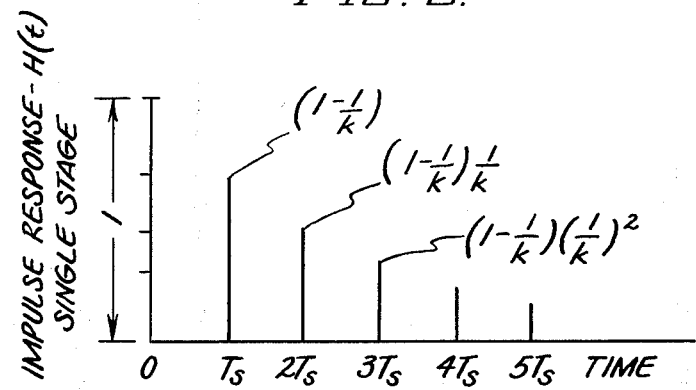
FIG. 6 is a diagram showing the impulse response of a stage of the first shift register of the apparatus of FIG. 1 including the accumulator stage associated therewith.

Reference is now made to FIGS. 1–3 which show apparatus 10 in accordance with the present invention. The apparatus is formed on a common semiconductor substrate 20 having a major surface 21 and comprises a first serial charge transfer shift register 11 of N stages, conveniently shown as three, and a second serial charge transfer shift register 12 of the same number N of stages as the first shift register 11 and arranged in parallel therewith. Each stage of the first shift register has integrally associated therewith a respective accumulator stage 13 and a respective gating stage 14.

Each of the stages of the first shift register 11 includes a respective first electrode $15a$ of generally rectangular outline insulatingly overlying the major surface of the substrate and providing a respective first storage region $16a$ therewith. Each accumulator stage 13 includes a respective third electrode 17 of generally rectangular outline insulatingly overlying the major surface of the substrate and providing a respective third storage region 18 therewith. A long edge 23 of each third electrode 17 is spaced a short distance from and parallel to a part 25 of a long edge 24 of a respective first electrode 15a. Each gating stage 14 includes a respective gating electrode 27 insulatingly overlying the first electrode 15a and third electrode 17 for establishing a conduction channel between the first and third storage regions thereof.

Each stage of the second shift register 12 includes a respective first electrode 15b of generally rectangular outline insulatingly overlying the major surface 21 of the substrate 22 and providing a respective first storage region 16b therewith. Each first storage regions 16b is located in tandem with the first storage region 16a of the first shift register 11. An input stage 41 coupled to the input of first stages of the first and second shift registers 11 and 12 is also provided. An output stage 42 coupled to output of the last stages of the first and second shift registers is further provided.

A sequence of packets of charge corresponding to samples of a signal from an input circuit 28 is serially applied to the input stage 41. The first storage regions of the first and second shift registers are coupled to the input stage such that in the process of transfer of charge from the input stage 41 to these regions during one half of a clocking cycle a charge packet divides in accordance with a fixed ratio. During the first half of a clocking cycle a first fixed fraction b of an initial charge packet designated as a first part is clocked into the first storage regon 16a of the first stage of the first shift register and stored or contained therein and a second part (1−b) of the charge packet is clocked into the first storage region 16b of the first stage of the second shift register and stored therein. During the interval of this half of the clocking cycle, actuation of the gating stage 14 establishes a conduction channel between the first storage region 16a and the third storage region 18 to combine the charges in these storage regions. Upon de-actuation of the gating stage, the combined charge in the first and third storage regions is divided into a second fixed fraction 1/k designated as a first portion contained in the first storage region and a second portion (1−1/k) contained in the third storage region. The first portion of the combined charge is transferred out of the first storage region into the second storage region of the first stage during the second half of the clocking cycle. The second portion of the combined charge is stored or contained in the third storage region for processing over succeeding clocking cycles. The first and third storage regions constitute a charge storage cell. The charge stored in the first storage region is proportional to the capacitance of the first electrode with respect to the substrate, referred to as the first capacitor, and the charge stored in the third storage region is proportional to the capacitance of the third electrode with respect to the substrate, referred to as the third capacitor. The first portion 1/k of the combined charge is equal to the ratio of capacitance $C_1$ of the first capacitor divided by the sum of the capacitance $C_1$ of the first capacitor and the capacitance $C_3$ of the third capacitor. The second portion (1−1/k) of the combined charge is equal to the ratio of the capacitance $C_3$ of the third capacitor divided by the sum of the capacitance $C_1$ of the first capacitor and the capacitance $C_3$ of the third capacitor.

The first portion of the charge is clocked out of the first stage of the first shift register into the second stage of the first shift register wherein it undegoes the equilibration and divide operation described in connection with the first stage to providing a next first portion of charge which is clocked into the third stage of the first shift register during the third clock cycle. The equilibration and divide operation is repeated during the third clock cycle to provide a final first portion of charge which is clocked out into the output stage 42 during the fourth clocking cycle. During the first, second and third clocking cycle the second part (1−b) of the initial packet is clocked into the first, second and third stages of the second shift register. During the fourth clock cycle the second part of the initial packet is clocked into the output stage where it combines with the final first portion of the charge. The combined charge is sensed and an output signal is obtained.

To provide zero output response at a particular angular frequency $\omega_z$, the first fixed fraction b and the second fixed fraction i/k are particularly selected. In the frequency domain, each of the stages of the first shift register with its associated accumulator stage has a certain amplitude and phase response, and in fact constitutes a low pass filter with a phase shift that increases with frequency. The variation of amplitude and phase shift as a function of frequency is dependent on the aforementioned second fixed fraction. For a zero amplitude response at a particular angular frequency $\omega_z$, the second fixed fraction is selected to provide a phase shift at that frequency which, when multiplied by the number of stages N, equals $\pi$ radians, i.e., a phase shift of 180 degrees. Concurrently, the first fixed fraction b is selected so that the amplitude of the output of the N cascaded stages of the first shift register at the frequency $\omega_1$ is equal to the amplitude of the output of the second shift register at that frequency, i.e., $b \cdot /H_N(\omega_z)/ = 1 - b$.

The apparatus 10 is formed on a semiconductor substrate 20 of N-type conductivity having a major surface 21. Typically, the substrate may be silicon semiconductor material of suitable resistivity, for example, 4 ohm-centimeters. The shift register 11 and 12 are formed over parallel channel portions 29a and 29b of the substrate 20. Overlying the major surface 21 of the substrate 20 is a thick insulating member 30 of silicon dioxide having thin portions 31a and 31b, for example 1000 Angstroms thick, lying in registry with the channel portions 29a and 29b respectively and separated by elongated thick insulating member 30a. A plurality of first conductors 15 of generally rectangular outline is provided on the insulating member 30 having portions 15a and 15b overlying thin portion 31a and 31b, respectively. Each of portions 15a and 15b of conductor 15 are referred to as first electrodes. Each of the first electrodes is of uniform length in the direction of the length dimension of the channel portions 29a and 29b, i.e., in the direction of charge transfer. A plurality of second conductors 34 is provided on the insulating member 30 having portions 34a and 34b overlying the thin portions 31a and 31b, respectively. Each of portions 34a and 34b of conductor 34 are referred to as second electrodes. Each of the second electrodes is of uniform length in the direction of the length dimension of the channel portions 29a and 29b.

A plurality of auxiliary conductors 33 is provided on the insulating member 30 having portions 33a and 33b overlying thin portions 31a and 31b. Each of portions 33a and 33b are referred to as auxiliary electrodes. Each auxiliary electrode 33a is spaced between a second electrode 34a and a first electrode 15a. A plurality of high conductivity regions of opposite conductivity type 36a is provided in the channel 29a between an auxiliary electrode 33a and an adjacent first electrode 15a. One edge of region 36a underlies an edge of the auxiliary electrode 33 and the other edge of region 36a underlies an edge of first electrode 15a. A plurality of high conductivity regions 36b is also provided in the channel portion 29b between an auxiliary electrode 33b and an adjacent first electrode 15b. The high conductivity region 36a of opposite conductivity improves lateral conductivity in the storage region underlying the first electrode 15a and enables rapid equilibration of charge in this storage region. The auxiliary electrode 33a is provided to facilitate the formation of the leading edge of the region 36a of opposite conductivity type. Another thin layer 35 of insulation, for example 1000 Angstroms thick, is provided over the conductors 15 and 34. A plurality of first transfer conductors 37 are provided over the insulating layer 35 each including portions 37a and 37b referred to as first transfer electrodes. Each of the first transfer electrodes 37a is insulatingly spaced between a respective second electrode 34a and an adjacent succeeding auxiliary electrode 36a and overlying these electrodes. Each of the first transfer electrodes 37b is insulatingly spaced between a respective second electrode 34b and an adjacent succeeding auxiliary electrode 37b and overlying these electrodes. A plurality of second transfer conductors 38 are provided over the insulating layer 35, each including portions 38a and 38b referred to as second transfer electrodes. Each of the second transfer electrodes 38a is insulatingly spaced between a respective first electrode 15a and an adjacent succeeding second electrode 34a and overlying these electrodes. Each of the second transfer electrodes 38b is insulatingly spaced between a respective first electrode 156 and an adjacent succeeding second electrode 34b and overlying these electrodes. The first and second transfer conductors are shown in dotted outline to illustrate with clarity the structure and organization of the apparatus.

All of the first electrodes 15a and 15b of the shift registers 11 and 12 are connected to a line 51 which a $\phi_D$ voltage is supplied from a fixed voltage source 55. All of the second electrodes 34a and 34b of the first and second shift registers 11 and 12 are connected to line 52 to which a $\phi_C$ voltage is supplied from a clocking waveform generator 56. The clocking waveform generator 56 is under the control of the timing generator 57. All of the first transfer electrodes 37a and 37b of the shift registers 11 and 12 are connected to a $\phi_D'$ line 53 to which a $\phi_D'$ voltage is supplied from fixed voltage source 55. All of the second transfer electrodes 38a and 38b of the shift registers 11 and 12 are connected to a $\phi_C'$ line 54 to which a $\phi_C'$ voltage is applied from a clocking waveform generator 56. The auxiliary electrodes 33a and 33b are connected to line 53 which provides a $\phi_D'$ voltage thereto. The $\phi_C$, $\phi_D$, $\phi_C'$ and $\phi_D'$ voltage waveforms are shown in FIGS. 5A through 5D, respectively. A conductive layer 66 of a suitable material such as gold is eutectically bonded to the lower surface of the substrate 20 to provide a substrate contact to which the ground terminals of the $\phi_D$, $\phi_D'$, $\phi_C$ and $\phi_C'$ voltage sources are connected.

Each set of electrodes 37a, 33a, 15a, 38a and 34a serially arranged on a respective thin portion 31a of the insulating member 30 and overlying a respective part of channel 29a, form a stage of the first shift register 11. Each set of electrodes 37b, 33b, 15b, 38b and 34b, serially arranged on a respective thin portion 31b of the insulating member 30 and overlying a respective part of channel 29b, form a stage of second shift register 12.

Each accumulator stage 13 is formed on a respective channel portion 64 of the substrate 20 which is laterally spaced from the channel portion 29a and abutting a respective storage region 16a thereof. A thin insulating portion 65 is provided in registry with the channel portion 64. A third electrode 17 of elongated outline is provided overlying a portion of the thin insulating layer. The long edge 25 of the electrode 17 is spaced a short distance from and parallel to a part 25 of an adjacent long edge 24 of the first electrode 15a. The third electrode 17 is connected to line 51 to which a $\phi_D$ voltage is applied. Thus, with the application of this potential to the third electrode, a third storage region 18 is provided in the substrate.

Each gating stage 14 is formed on a respective channel portion 64 and includes a gating electrode 27 insulatingly overlying the adjacent long edges of electrodes 15a and 17. The gating electrode 27 is connected to gating waveform generator 58 which provides gating voltage $\phi_G$, as shown in FIG. 5E. The gating waveform generator 58 is synchronized with the timing generator 57. When the gate voltage $\phi_G$ is applied to the gate electrode 27, a conductive channel is formed in the underlying surface adjacent region of the substrate 20 which enables equilibration of charge in the first storage region 16a underlying the electrode 15a of the first shift register 11 with the charge in the third storage region 18 underlying the electrode 17 of the accumulator stage 13.

Each stage of the first shift register 11 includes a $\phi_D$ storage region underlying a $\phi_D$ electrode 15a and $\phi_C$ storage region underlying a $\phi_C$ electrode 34a. The $\phi_D$ voltage applied to the $\phi_D$ electrode is fixed and produces a surface potential in the substrate underlying the $\phi_D$ electrode which is fixed. The $\phi_C$ voltage applied to the $\phi_C$ electrode cycles between a high level and a low level above and below the $\phi_D$ voltage and produces a surface potential in the substrate underlying the $\phi_C$ electrode which cycles between a level above and below the fixed level underlying $\phi_D$ electrode. When the $\phi_C$ voltage is at its high level, charge transfer is enabled from the $\phi_C$ storage region, and conversely when the $\phi_C$ voltage is at its low level, charge transfer from the $\phi_D$ storage region to the $\phi_C$ storage region is enabled. Each stage also includes a $\phi_D'$ electrode 37a to which is applied a $\phi_D'$ voltage of fixed value which produces a surface potential in the substrate underlying the electrode which is smaller in absolute magnitude than the surface potential underlying a $\phi_D$ electrode. Each stage also includes a $\phi_C'$ electrode 38a to which is applied a $\phi_C'$ voltage having two levels. At the upper level a surface potential is produced in the substrate underlying the electrode which inhibits the transfer of charge from a $\phi_D$ storage region to a $\phi_C$ region. At the lower level a surface potential is produced enabling the transfer of charge from a $\phi_D$ storage region to a $\phi_C$ storage region. Thus, when the $\phi_C$ voltage is at its high level, charge is transferred from a $\phi_C$ storage cell to a $\phi_D$ storage cell, when both the $\phi_C$ voltage and the $\phi_C'$ voltage are at their low levels, charge is transferred from a $\phi_D$ storage cell to a $\phi_C$ storage cell. For each cycle of the clocking voltages $\phi_C$ and $\phi_C'$, charge is transferred from a $\phi_C$ storage cell to a $\phi_D$ storage cell and then to the next succeeding $\phi_C$ cell.

Each stage of the second shift register 12 also includes a $\phi_D$ storage region underlying a $\phi_D$ electrode 15b and a $\phi_C$ storage region underlying a $\phi_C$ electrode 34b, a $\phi_D'$ electrode 37b, and a $\phi_C$ electrode 38b. The manner in which charge is clocked from storage region to storage of the second shift register 12 is identical to the manner in which charge is clocked from storage region to storage region in the first shift register 11.

The input stage 41 is formed on a channel portion 29c of the substrate 20 which is contiguous to channel portion 29a and 29b and of a width equal to the sum of the widths of these channels. A thin portion 31c is provided in thick insulating member 30 lying in registry with the channel portion 29c. A first electrode 15c of generally rectangular outline is provided on the insulating member 30 overlying the thin portion 31c. A second electrode 34c is provided on the insulating member 30 overlying the thin portion 31c. An insulating layer 35 is provided over the electrodes 15c and 34c. A first transfer electrode 37c is provided over the insulating layer 35. The first transfer electrode 37c is insulatingly spaced in front of and overlying first electrode 15c. A second transfer electrode 38c is provided over the insulating layer 35. The second transfer electrode 38c is insulatingly spaced between a first electrode 15c and the second electrode 34c and overlying these electrodes.

The output stage 42 is formed on a channel portion 29d of the substrate 20 which is contiguous to channel portion 29a and 29b and of a width equal to the sum of the width of these channels. A thin portion 31d is provided in thick insulating member 30 lying in registry with the channel portion 29d. A first electrode 15d of generally rectangular outline is provided on the insulating member 30 overlying the thin portion 31d. A second electrode 34d is provided on the insulating member 30 overlying the thin portion 31d. An insulating layer 35 is provided over the electrodes 15d and 34d. A first transfer electrode 37d is provided over the insulating layer 35. The first transfer electrodes 37d is insulatingly spaced in front of and overlying first electrode 33d. A second transfer electrode 38d is provided over the insulating layer 35. The second transfer electrode 38d is insulatingly spaced between the first electrode 15d and the second electrode 34d and overlying these electrodes.

The first electrodes 15c and 15d of the input and output stages 41 and 42 are connected to line 51 to which a $\phi_D$ voltage is supplied from a fixed voltage source 55. All of the second electrodes 34c and 34d of the input and output stages 41 and 42 are connected to line 52 to which a $\phi_C$ voltage is supplied from a clocking waveform generator 56. All of the first transfer electrodes 37c and 37d of the input and output stages 41 and 42 are connected to a $\phi_D'$ line 53 to which a $\phi_D'$ voltage is supplied from fixed voltage source 55. All of the second transfer electrodes 38c and 38d of the input and output stages 41 and 42 are connected to a $\phi_C'$ line 54 to which a $\phi_C'$ voltage is applied from a clocking waveform generator 56.

Packets of charge for insertion into the input stage are generated by an input circuit 28 in response to an input signal. Input circuits such as input circuit 28, are well-known in the art, one of which is described in connection with FIGS. 8A, 8B and 8C in the U.S. Pat. No. 4,032,867, assigned to the assignee of the present invention and incorporated herein by reference thereto. This particular circuit is referred to as a "fill and spill" circuit. Of course, other input circuits may be utilized. A bias voltage source 28a connected to the input circuit 28 provides a fixed bias charge component to each packet of charge developed by the input circuit 28a which facilitates the transfer thereof. The output of the input circuit 28 is applied to the input stage 41.

Packets of charge from the output stage 42 are sensed by an output circuit 67. An output circuit suitable for providing an output in accordance with the sequence of packets of charge clocked thereinto is described in connection with FIG. 6 of patent application Ser. No. 105,756, filed Dec. 20, 1979, assigned to the assignee of the present invention and incorporated herein by reference thereto.

The operation of the apparatus of FIGS. 1-4 will now be explained in connection with the waveform diagrams of FIGS. 5A through 5E. A first sequence of charge samples or packets are generated by input circuit 28 and is serially applied to the input stage 41. During the first half of a first clocking cycle, $t_0$-$t_1$, a charge packet is divided into a first part b and a second part (1−b). The first part b is transferred into the first storage region underlying electrode 15a of the first stage of the first shift register. The second part (1−b) is transferred into the storage region 15b underlying the electrode 15b of the first stage of the second shift register. During an interval $t_a$-$t_b$ of the first half of the first clocking cycle a pulse 71 of gating voltage is applied to gating electrode 27 establishing a conduction channel between the first storage region 16a and the third storage region 18 of the first stage of the first shift register thereby combining the charges in these storage regions. While the interval $t_a$-$t_b$ is short, it is of sufficient duration to enable charge in the first and third storage regions to equilibrate, i.e., attain the same potential. Upon termination of the pulse 71 the charge in the storage cell comprising the first and third storage regions is divided into a first portion 1/k contained in the first storage region 16a and a second portion 1−1/k contained in the third storage region 18. The second portion of the combined charge is stored in the third storage region for processing over succeeding clocking cycles. Over the second half ($t_1$-$t_2$) of the first clocking cycle the first portion of the combined charge is transferred into the second storage region underlying electrode 34a of the first stage of the first shift register. Over the second clock cycle $t_2$-$t_4$, the first portion of the charge is clocked out of the first stage of the first shift register into the second stage of the first shift register wherein it undergoes the equilibration and divide operation described in connection with the first stage to providing the next first portion of charge. Over the third clock cycle $t_4$-$t_6$, the first portion of charge from the second stage is clocked into the third stage of the first shift register. The equilibration and divide operation is repeated in the third stage during the third clock cycle to provide a final first portion of charge. Over the fourth clock cycle, $t_6$-$t_8$, the first portion of charge from the third stage is clocked out into the output stage 42. During the first, second and third clocking cycles the second part (1−b) of the input packet is clocked into the first, second and third stages of the second shift register 12. During the fourth clock cycle the second part is clocked into the output stage where it combines with the final first portion of the charge. The combined charge is sensed and an output signal is obtained.

Starting with the second clocking cycle the second packet of charge of the input or first sequence is divided into a first part b which is applied to the first shift register 11 and a second part (1−b) which is applied to the second shift register 12. Over succeeding clock cycles the first part of the second packet is processed in the same manner as the first part of the first packet of the input sequence. Also, over succeeding clocking cycles the second part of the second packet is processed in the same manner as the second part of the first packet. The outputs of the first and second shift registers are combined to provide the next element of the output sequence.

If a first sequence consisting of a single packet $Q_n$ were clocked into the first stage of the first shift register, at the output of the first stage a second sequence of packets would be obtained in which the initial packet would have a magnitude of $$Q_n\left(\frac{C_1}{C_1+C_3}\right),$$

corresponding to the first part of the combined charge, where $C_1$ is the capacitance of electrode 15a with respect to the substrate, and $C_3$ is the capacitance of electrode 17 with respect to the substrate. The second output packet would have a magnitude $$\left(\frac{C_1}{C_1+C_3}\right)Q_n\left(\frac{C_3}{C_1+C_3}\right).$$

The third output packet would have a magnitude of $$\left(\frac{C_1}{C_1+C_3}\right)Q_n\left(\frac{C_3}{C_1+C_3}\right)^2$$

and so on for the succeeding packets. This sequence of successive values represents the impulse response of the first stage. The impulse response is shown in FIG. 6 and is given by the following expression:

$$H(t) = \left(1 - \frac{1}{k}\right)e^{-\alpha nT} \qquad (1)$$

where $k=(C_1+C_3)/C_3$, T is the clocking period, n is the period number, and $\alpha$ is the attenuation constant. The attenuation constant $\alpha$ can be readily determined in the following manner. Over a single clock period T the charge in the storage region 16a of the first stage of the first shift register is reduced by a factor of $C_3/(C_1+C_3)$. Thus, $$\frac{C_3}{C_1+C_3} = e^{-\alpha T}, \text{ or} \qquad (2)$$

$$\alpha = \frac{1}{T}\ln\frac{C_1+C_3}{C_3}$$

Figure 7:
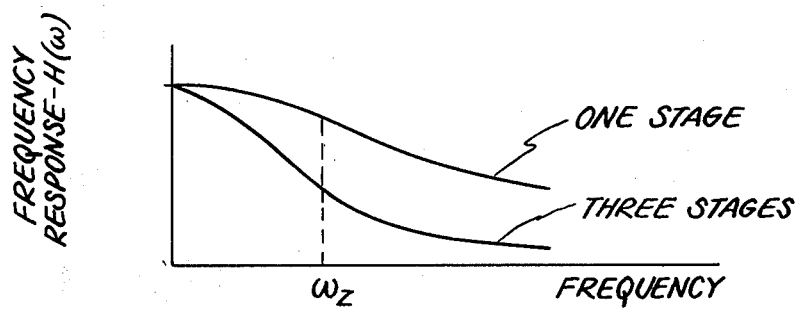
FIG. 7 is a diagram of the frequency response of a stage of the first shift register of the apparatus of FIG. 1 including the accumulator stage associated therewith.

The frequency response of a single stage of the first shift register is obtained by transforming the impulse response of FIG. 6 into the frequency domain. The frequency response $H_1(\omega)$ of a single stage of the filter is shown in FIG. 7, and is given by the equation:

$$H_1(\omega) = \frac{k-1}{k-e^{-j\omega t}} \qquad (3)$$

The absolute value of the frequency response for a single stage of the first shift register is given by the equation:

$$|H_1(\omega)| = \frac{k-1}{\sqrt{(k-\cos\omega T)^2 + (\sin\omega t)^2}}$$

For N cascaded stages the expression of the absolute value of the frequency response is the following:

$$|H_1(\omega)| = \frac{(k-1)^N}{[(k-\cos\omega T)^2 + (\sin\omega t)^2]^{\frac{N}{2}}} \qquad (4)$$

Figure 8:
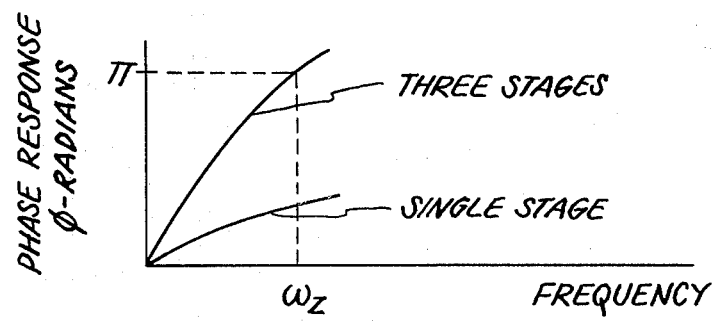
FIG. 8 is a diagram of the phase response of a stage of the first shift register of the apparatus of FIG. 1 including the accumulator stage associated therewith.

The variation of phase with frequency for a single stage of the first shift register is shown in FIG. 8 and is given by the equation:

$$\phi_1 = \arctan\frac{\sin\omega T}{k-\cos\omega T} \qquad (5)$$

For N cascaded stages the total phase shift $\phi_N$ is given by the equation:

$$\phi_N = N\phi_1 \qquad (6)$$

To provide zero output at a particular annular frequency $\omega$, the first fixed fraction b and the second fixed fraction 1/k are particularly selected. The second fixed fraction is selected to provide a phase shift at signal frequency $\omega_z$ which when multiplied by the number of stages N equals $\pi$ radians or 180 degrees. The first fixed fraction b is selected so that the amplitudes of the outputs of the first and second shift registers at the frequency $\omega_z$ are equal. For the first shift register consisting of three stages, i.e., for N equal to 3, this requirement is set forth in the following equation:

$$b|H_3(\omega_z)| = 1-b,$$

where $|H_3(\omega_z)|$ is the absolute value of the amplitude of the output of the first shift register for unity amplitude input. Accordingly, $$b = \frac{1}{1+|H_3(\omega_z)|}. \qquad (7)$$

The value of $|H_3(\omega_z)|$ is readily obtained from the frequency response characteristic of first shift register which is the frequency response of a single stage cubed, and is shown in FIG. 7.

While in FIG. 1 a filter is shown and described to which a unipolar input is applied and from which a unipolar output is obtained, it will be understood that the filter apparatus may be used in bipolar filter systems in which both positive weighted and negative weighted input signals are provided and from which both positive and negative weight outputs are obtained. In such a system two identical structures such as shown in FIG. 1 would be provided. The positive weighted signal would be applied to the input of one of the structures and the negative weighted signal would be applied to the other structure. At the output of the first structure a positive weighted output would be obtained and at the output of the other structure a negative weighted output would be obtained. Such a bipolar system may be readily cascaded with other similarly constituted bipolar charge transfer filter systems, such as described and claimed in U.S. patent application Ser. No. 105,756, filed Dec. 20, 1979, and assigned to the assignee of the present application. In such a bipolar system the output signal is recovered by differentially summing corresponding samples of the positive and negative weighted output sequences.

While the filter of FIGS. 1-4 utilizes charge transfer devices in which charge storage and transfer occurs in cells adjacent the surface of the semiconductor substrate, the present invention may be implemented with cells of opposite conductivity type regions. Structures of this type, commonly referred to as buried channel charge transfer devices are described in U.S. Pat. No. 3,902,187, assigned to the assignee of the present invention and incorporated herein by reference thereto. In such buried channel charge transfer devices charge storage and transfer occurs in cells below the surface of the semiconductor substrate. Implementation of prior art charge transfer filters with buried channel devices has particular advantages with respect to high speed operation, but suffers from nonlinearities resulting from the variable capacitance between the charge storage cells and their associated overlying electrodes. In the present invention such nonlinearities are not introduced into the output. In connection with a buried channel implementation, of course, surface charge input circuits such as those described above could be used.

The filter apparatus of the present invention may also be implemented in bucker brigade technology; however, such implementation would be less advantageous than in the charge coupled technology shown and described in FIGS. 1-4, as bucket brigade devices are subject to charge transfer inaccuracies which limit their performance.

While the invention has been described in specific embodiments in which single phase clocking systems have been employed, it will be understood that other clocking systems such as multi-phase clocking systems may as well be employed.

While the invention has been described in connection with apparatus constituted of N-type conductivity substrates, P-type conductivity substrates could as well be used. Of course, in such a case the applied potentials would be reversed in polarity.

While the invention has been described in specific embodiments, it will be understood that modifications, such as those described above, may be made by those skilled in the art, and it is intended by the appended claims to cover all such modifications and changes as fall within the true spirit and scope of the invention.

What I claim as new and desire to secure by Letters Patent of the United States is:

1. In combination, a substrate of semiconductor material of one conductivity type having a major surface, means forming a plurality of N charge storage cells adjacent said major surface of said substrate, each storage cell including a first electrode and a second electrode, said first and second electrodes insulatingly overlying said storage cell, said first electrode and said substrate forming a first capacitor having a first capacitance, said second electrode and said substrate forming a second capacitor having a second capacitance, a first shift register formed in said substrate having N serial coupled stages, each stage including a respective first charge storage region in said substrate underlying a respective one of said first electrodes, a second shift register formed in said substrate having N serial coupled stages, each stage including a respective first charge storage region in said substrate, first means for sequentially transferring packets of charge at one frequency from first charge storage region to first charge storage region of the stages of said first shift register, second means for sequentially transferring packets of charge at said one frequency from first charge storage region to first charge storage region of the stages of said second shift register, means for providing a first sequence of packets of charge, each packet representing a respective sample of an input signal, successive packets occurring at said one frequency, means for dividing each of said packets of charge of said first sequence into a first part and a second part, the ratio of said first part to said second part being equal to a first fixed value, means for applying sequentially each of said first parts of said packets of said first sequence to the first stage of said first shift register and for applying sequentially each of said second parts of said packets of said first sequence to the first stage of said second shift register, a plurality of combining means, each for combining the charge packet in the first charge storage region of a respective stage of said first shift register with the charge packet in an associated second charge storage region and for dividing the combined packet of charge into two portions over one part of a cycle of said first charge transferring means, a first portion of said combined packet being stored in the first charge storage region of a stage of said first shift register and a second portion of said combined pocket being stored in the second charge storage region associated therewith, the ratio of said first portion of charge to the combined packet of charge being equal to a second fixed value, said second fixed value being equal to the ratio of said first capacitance of the sum of said first capacitance and said second capacitance, the frequency response of each of the stages of said first shift register decreasing as the frequency of the input signal thereto increases and the shift in phase of the frequency response of each of the stages of said first register increasing as the frequency of the input signal thereto increases, said second fixed value providing a phase shift at a predetermined angular frequency $\omega_z$ which is equal to $\pi$ radians divided by an integer, said integer being equal to N, the number of stages in said first and second shift registers, said first fixed value being equal to $$\frac{1}{1 + /H_N(\omega_z)/}$$

where $|H_N(\omega_z)|$ is the absolute magnitude of the amplitude response of N cascaded stages of said first shift register at said predetermined angular frequency $\omega_z$, means for combining the output of the last stage of said first shift register with the output of the last stage of said second shift register, whereby a resultant output is obtained having zero amplitude at angular frequency $\omega_z$.

2. The combination of claim 1 in which said first charge storage regions are formed adjacent a major surface of said substrate of semiconductor material.

* * * * *